HOUSING FOR TRANSISTOR DIE

Filed Oct. 8, 1964

INVENTOR
JEAN-PAUL LEON DREYFUS
BY Sughrue, Rothwell, Mion, Zinn & Macpeak
ATTORNEYS

United States Patent Office 3,333,167 Patented July 25, 1967

3,333,167
HOUSING FOR TRANSISTOR DIE

Jean-Paul Leon Dreyfus, 1108 Denise Drive, Raleigh, N.C. 27606

Filed Oct. 8, 1964, Ser. No. 402,466
8 Claims. (Cl. 317—235)

The present invention relates to a novel housing for transistor-like dice and a method for mounting transistor-like dice in the novel housing.

Prior art transistor dice have had element contact areas on both faces of the die. That is, the base and emitter contact areas are on one side of the semiconductor die and the collector contact area is on the opposite side of the semiconductor die. In mounting the die in a housing for connection to external circuitry, the external lead posts have been connected to the element contact areas individually by a slow procedure to insure proper contact between the external leads and the contact areas.

The present invention does away with the need for individually connecting contact areas of the die to the lead posts, and differs from the prior art by positioning the die having all element contact areas on a single surface in a recessed bed of the structure. The lead posts extend into the recessed bed and touch directly the relatively larger element contact areas. Proper location of the die in the housing ceramic case is obtained by a recessed bed, and matching of the lead posts with the element areas is always obtained as the former are small, relatively to the larger element contact areas. The lead posts are permanently attached to the element contact areas by bonding, brazing, or soldering processes forming no part of the present invention.

Although the invention is described in terms of a housing unit for a transistor-like die, it should be understood that the invention is applicable to any semiconductor device of the type having the element contact areas on a single surface.

The novel structure is easier to assemble than the prior art structures and results in a cost-saving manufacture of transistor-type products.

It is an object of the invention to provide a simplified transistor-like unit.

It is also an object of the present invention to provide a housing for transistor-like devices having all element contact areas on one face of the die.

The invention is illustrated in the accompanying drawings wherein.

Figures 1, 2, 3:
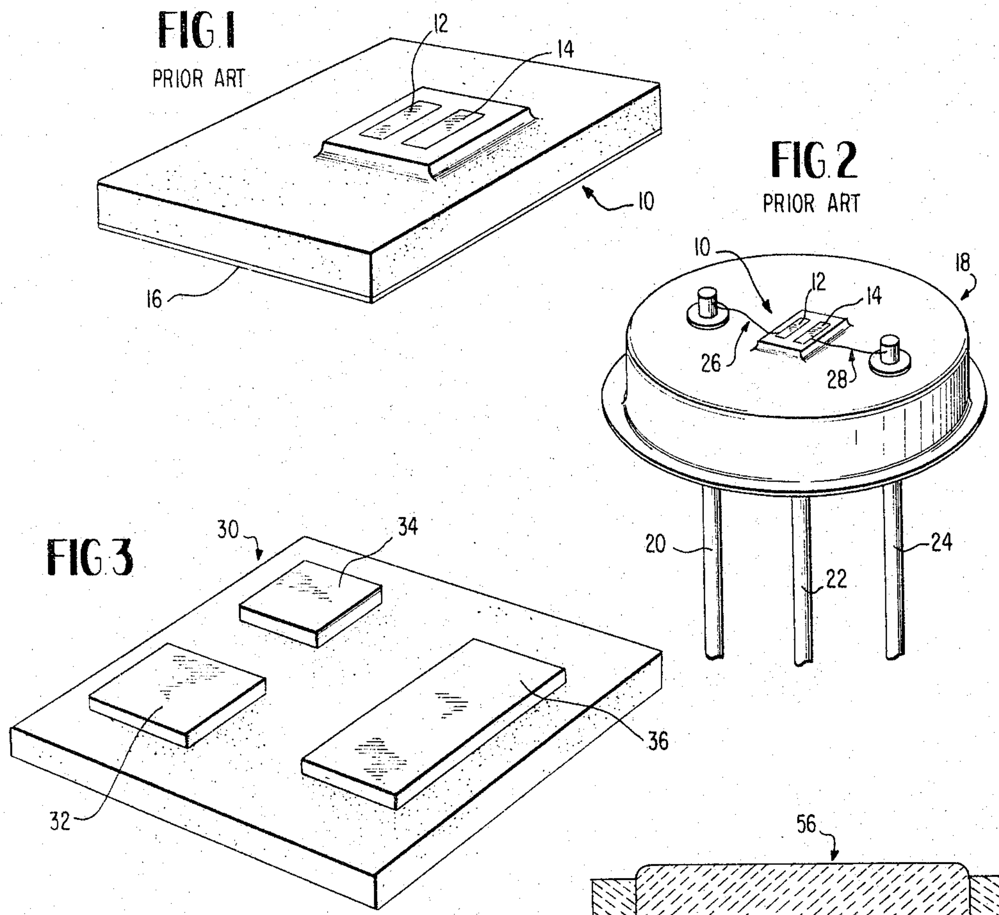
FIGURE 1 is a conventional transistor-like die having element contact areas on both sides of the die.
FIGURE 2 is a prior art housing for the die shown in FIGURE 1.
FIGURE 3 is a semiconductor die, used in the present invention, having all element contact areas on a single face.

In FIGURE 1, a conventional semiconductor die 10 is shown having element contact areas 12 and 14 on one face of the die and element contact areas 16 on the opposite face of the die. The element contact areas are respectively the base 12, the emitter 14, and the collector 16.

In FIGURE 2, the semiconductor die 10 is shown mounted in a prior art-type housing 18. Lead post 22 is connected to element contact area 16 of die 10 through the bottom of housing 18. Lead posts 20 and 24 extend completely through housing 18 and are connected respectively to element contact areas 12 and 14 by contact wires 26 and 28. Contact wires 26 and 28 must be individually positioned for attachment to the small contact areas 12 and 14 respectively.

In the present invention, the type of transistor-like die which is used is shown in FIGURE 3. Transistor-like die 30 has three element contact areas 32, 34, and 36, on a single face. Element contact areas 32, 34, and 36 are respectively the base, emitter, and collector contact areas of semiconductor die 30. Semiconductor dice of the type shown in FIGURE 3, having all element contact areas on a single face, may be manufactured by differentially diffusing different impurity layers into a large semiconductor wafer and then slicing individual dice from the wafer. Such methods are well known in the field of planar technology. The contact areas may be made of a material such as aluminum which is deposited on an oxide layer which coats the top surface of the semiconductor. Small portions of the element contact areas extend through apertures in oxide layer thus making contact with the base, emitter and collector portions of the semiconductor material. The drawing in FIGURE 3 shows only those details of semiconductor dice necessary to an understanding of the present invention.

Figure 4:
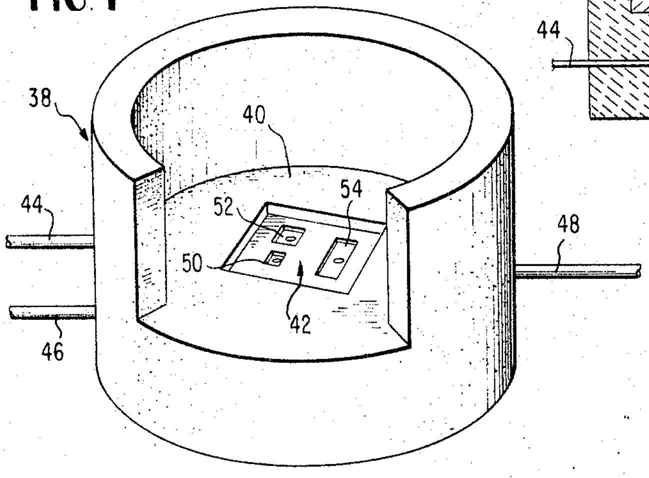
FIGURE 4 is a partially cutaway view of a housing for the semiconductor die of FIGURE 3.

FIGURE 4 shows a housing 38 for the semiconductor die 30. Housing 38 is preferably a ceramic housing of cylindrical shape which is hollow in the upper portion. Internal surface 40 of housing 38 has a recessed bed 50 which is properly dimensioned so that semiconductor die 30 will fit snugly into the recess. Lead posts 44, 46, and 48 extend through housing 38 and have terminals 50, 52, and 54 respectively which are located at the bottom of the recessed bed 42. Terminals 50, 52, and 54 are slightly smaller in size than the element contact areas of die 30 to which they are to be attached.

Die 30 is turned upside down and placed snugly into the recessed bed 42 so that element contact areas 34, 32, and 36 are in contact with terminals 52, 50, and 54 respectively. The shape of the recess and the relative sizes of the element contact areas and the terminals insures a proper contact between the terminals and the contact areas when the die is placed upside down in the recessed bed.

Figure 5:
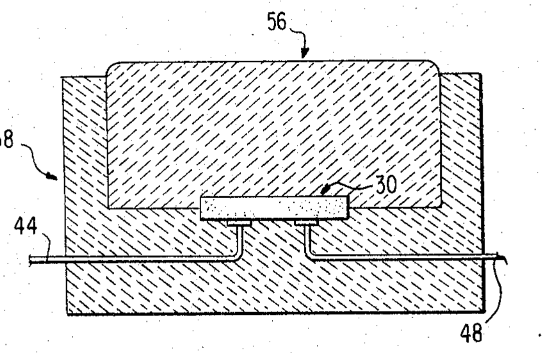
FIGURE 5 is a side view of the housing shown in FIGURE 4 with the semiconductor device mounted therein.

The final product is shown in FIGURE 5. A lid 56 which may be of the same material as housing 38 is placed over the opening of housing 38. Since the housing and lid are made of a ceramic material, preferably ceramic glass, proper heat dissipation will be assured due to the properties of the ceramic housing.

While there have been shown and described and pointed out the fundamental novel features of the invention as applied to the preferred embodiment, it will be understood that various omissions and substitutions and changes in the form and details of the device illustrated and in its operation may be made by those skilled in the art without departing from the spirit of the invention. It is the invention, therefore, to be limited only as indicated by the scope of the following claims.

I claim:

1. The combination comprising: a transistor die of the type having a number of metallic element contact areas on a single surface of said die; a housing for said die; said housing having a base with a recess in the surface thereof; said recess being dimensioned to form a snug fit with said die, a plurality of contact leads, one for each element contact area of said transistor die; said contact leads extending through said base and terminating in said recess; said transistor die positioned in said recess and having said element contact areas directly contacting the ends of said contact leads which terminate in said recess.

2. The combination claimed in claim 1 wherein said housing is made of ceramic material.

3. The combination comprising; a transistor die having three discrete metallic element contact areas on a single surface of said transistor die, a ceramic glass plate having a recess in a surface thereof, said die being positioned in said recess with said single surface positioned downward in said recess, said recess forming a snug fit with said die, three leads extending from outside said ceramic glass plate through said ceramic glass plate and terminating in said recess, each termination of said leads respectively contacting one of said element contact areas.

4. The combination as claimed in claim 3 further comprising means in contact with said plate for providing heat dissipation.

5. A housing for a transistor die of the type having a number of discrete metallic element contact areas on a single surface, said housing comprising: a base member having a recessed bed in the surface of said base member, said recess bed being dimensioned to form a snug fit with said die, and a plurality of contact leads extending through said base member and terminating in said recessed bed; the terminals of said contact leads being positioned in said recessed bed so that each of said terminals will touch one of said element contact areas when said semiconductor die is placed in said housing.

6. The housing as claimed in claim 5 wherein said base member is made of ceramic material.

7. The combination comprising, a transistor die of the type having raised metallic base, emitter and collector contacts on a single surface thereof, said metallic contacts being of different sizes, a housing for said die, said housing comprising a base member having a recessed bed in the upper surface thereof approximately equal in dimension to said transistor die, first, second and third smaller recessed beds in said recessed bed, each of said smaller recessed beds having approximately the same dimensions as one of said metallic contacts respectively, first, second and third contact leads extending from outside said housing through said base member and terminating slightly above the surfaces of said smaller recessed beds respectively, said transistor die positioned in said housing so that said single surface is faced down and said die is held in position by said recessed bed with said base, emitter and collector contact areas fitting snugly within said first, second and third smaller recessed beds respectively and making contact with said first, second and third leads respectively.

8. A housing for a transistor die of the type having three discrete metallic element contact areas on a single surface thereof, said housing comprising: a base member having a recessed bed in the surface of said base member, said recessed bed being dimensioned to form a snug fit with said die, a plurality of contact leads extending through said base member and terminating in said recessed bed; the terminals of said contact leads being positioned in said recessed bed so that each of said terminals will touch one of said element contact areas when said transistor die is placed in said housing, and three smaller recesses in the surface of said recessed bed, at least one of said smaller recesses having a different size than the others of said smaller recesses, each of said smaller recesses being dimensioned slightly larger than one of said element contact areas respectively.

References Cited

UNITED STATES PATENTS

| | | | |
|---|---|---|---|
| 2,735,919 | 2/1956 | Shower | 317—235 |
| 2,762,001 | 9/1956 | Kilby | 29—155.56 X |
| 2,804,581 | 8/1957 | Lichtgran | 317—235 |
| 2,935,665 | 5/1960 | Coyle | 317—234 |
| 2,971,138 | 2/1961 | Meisel et al. | 317—234 |
| 2,989,669 | 6/1961 | Lathrop | 317—235 X |
| 3,178,506 | 4/1965 | Derich et al. | 174—52 |
| 3,178,621 | 4/1965 | Glickman | 317—234 |
| 3,202,888 | 8/1965 | Evander et al. | 317—234 |
| 3,220,095 | 11/1965 | Smith | 29—155.5 |
| 3,239,719 | 3/1966 | Shower | 317—101 |
| 3,241,010 | 3/1966 | Eddleston | 317—234 |

JOHN W. HUCKERT, *Primary Examiner.*

A. M. LESNIAK, *Assistant Examiner.*